US007164772B2

(12) United States Patent
Aoki et al.

(10) Patent No.: US 7,164,772 B2
(45) Date of Patent: Jan. 16, 2007

(54) SETTING UPDATE APPARATUS OF SCENE DATA IN AUDIO MIXER

(75) Inventors: Takamitsu Aoki, Hamamatsu (JP); Masaru Aiso, Hamamatsu (JP)

(73) Assignee: Yamaha Corporation, Hamamatsu (JP)

(*) Notice: Subject to any disclaimer, the term of this patent is extended or adjusted under 35 U.S.C. 154(b) by 796 days.

(21) Appl. No.: 10/459,875

(22) Filed: Jun. 12, 2003

(65) Prior Publication Data

US 2003/0231776 A1 Dec. 18, 2003

(30) Foreign Application Priority Data

Jun. 17, 2002 (JP) ............................ 2002-175386
May 7, 2003 (JP) ............................ 2003-129079

(51) Int. Cl.
*H03G 3/00* (2006.01)

(52) U.S. Cl. .......................... 381/61; 381/119; 700/94; 369/4; 84/625

(58) Field of Classification Search .................. 381/61, 381/119; 369/4; 700/94; 84/615, 625
See application file for complete search history.

(56) References Cited

U.S. PATENT DOCUMENTS 5,461,191 A * 10/1995 Kondo et al. ................. 84/615
5,652,797 A * 7/1997 Okamura et al. ............. 381/61
5,930,375 A * 7/1999 East et al. .................. 381/119
6,839,441 B1 * 1/2005 Powers et al. ............. 381/119

* cited by examiner

*Primary Examiner*—Vivian Chin
*Assistant Examiner*—Con P. Tran
(74) *Attorney, Agent, or Firm*—Morrison & Foerster LLP

(57) ABSTRACT

An apparatus is designed for updating setting of parameters so as to control an audio signal. In the apparatus, a holding section holds current values of the parameters effective to control the audio signal. A storing section stores a plurality of scene data, each scene data has a set of setting values of the parameters. A specifying section reads out one of the scene data from the storing section and specifies a setting value of at least one parameter contained in the read scene data. A determining section determines a unit updating amount of the specified parameter for use in a manual update mode according to both of the current value of the specified parameter and the setting value of the specified parameter. An updating section includes a manual operation device operable in the manual update mode for inputting an operation amount, computes an effective updating amount for the specified parameter according to the operation amount inputted by the manual operation device and the unit updating amount determined for the specified parameter, and updates the current value of the specified parameter by the calculated effective updating amount toward the setting value of the specified parameter in response to the inputting of the operation amount by the manual operation device.

8 Claims, 6 Drawing Sheets

SETTING UPDATE APPARATUS OF SCENE DATA IN AUDIO MIXER

BACKGROUND OF THE INVENTION

1. Technical Field of the Invention

The present invention relates to a setting update technology for selectively specifying setting values of parameters configured by a plurality of operation devices.

More specifically, the present invention relates to an audio mixer (audio mixing system) that uses the above-mentioned setting update function (scene function) for mixing audio signals (speech signals, musical sound signals, etc.) corresponding to a plurality of channels.

2. Prior Art

When a conventional audio mixing system used in concert halls or assembly halls mixes input signals supplied to a plurality of channels and outputs the signals from output channels, a plurality of operation devices is used to set values for various parameters such as levels and effects in order to adjust the sound volume, the sound quality, and the like.

A storage section saves the setting value for each parameter as one piece of "scene" data. Reading the scene data makes it possible to collectively change setting values for different parameters. This is called a scene function. The storage section can save a plurality of types of scene data.

When an instruction is made to read (recall) the scene data, a current value is automatically updated to the setting value read as the scene data in a specified period of time equivalent to an update transition time (fade time). However, the fade time needs to be configured on a special setting screen by activating a special setting mode.

For this reason, under the condition of the predetermined update fade time, an unintended situation may occur when the setting value is going to be updated automatically in accordance with the progress of a drama, for example. If there is a demand for changing the update fade time in response to the unintended situation, it has been impossible to quickly and appropriately change the update fade time.

SUMMARY OF THE INVENTION

The present invention has been made in consideration of the foregoing. It is therefore an object of the present invention to provide a setting update apparatus and a setting update program capable of quickly and appropriately adjusting the update fade time of current values of parameters configured by a plurality of operation devices when target setting values of the parameters are specified collectively.

According to the invention, an apparatus is designed for updating setting of at least one parameter which is set by an operation device so as to control an audio signal. The inventive apparatus comprises a holding section that holds a current value of the parameter effective to control the audio signal, a storing section that stores a plurality of scene data, each scene data comprising a set of setting values of parameters which are set by respective operation devices, a specifying section that reads out one of the scene data from the storing section and that specifies a setting value of at least one parameter contained in the read scene data, a determining section that determines a unit updating amount of the specified parameter for use in a manual update mode according to both of the current value of the specified parameter held in the holding section and the setting value of the specified parameter contained in the read scene data, and an updating section that includes a manual operation device operable in the manual update mode for inputting an operation amount, that computes an effective updating amount for the specified parameter according to the operation amount inputted by the manual operation device and the unit updating amount determined for the specified parameter, and that updates the current value of the specified parameter by the calculated effective updating amount toward the setting value of the specified parameter in response to the inputting of the operation amount by the manual operation device.

Preferably, the holding section holds the current values of the set of the parameters contained in each scene data, the specifying section specifies the set of the setting values of the parameters contained in the read scene data, the determining section determines a set of unit updating amounts of the specified parameters according to the set of the current values and the set of the setting values, and the updating section calculates a set of effective updating amounts corresponding to the set of the unit updating amounts of the specified parameters according to the inputted operation amount and updates the set of the current values of the specified parameters by the set of the effective updating amounts, in response to the inputting of the operation amount.

Preferably, the inventive apparatus further comprises a display section that displays a progression state from the current value to the setting value during the course of updating of the specified parameter.

Preferably, the inventive apparatus further comprises a direction detecting section that detects an operating direction of the manual operation device which can be operated in either of positive and negative directions, wherein the updating section increases the current value by the effective updating amount when the detected operating direction is the positive direction and decreases the current value by the effective updating amount when the detected operating direction is the negative direction.

Preferably, the determining section can determine another unit updating amount of the specified parameter for use in an automatic update mode according to both of the current value and the setting value of the specified parameter, and the updating section operates under the automatic update mode for updating the current value of the specified parameter by the determined unit updating amount every predetermined time interval toward the setting value of the specified parameter. In such a case, the inventive apparatus further comprises a mode detecting section that detects when one mode selected from either of the manual and automatic update modes is switched to the other mode of the manual and automatic update modes during the course of updating the specified parameter, wherein the updating section operates after the time of detecting the switching for continuing the updating of the current value held at the time of detecting the switching, under the other mode according to the unit updating amount which is determined for use in the one mode.

The present invention covers a program for use in a setting update apparatus having a storage storing a plurality of scene data, each scene data comprising a set of setting values of parameters which are set by operation devices, and having a processor for updating setting of at least one parameter so as to control an audio signal, the program being executable by the processor for causing the apparatus to perform a method comprising the steps of holding current values of the parameter effective to control the audio signal, reading out one of the scene data from the storage, specifying a setting value of at least one parameter contained in the read scene data, determining a unit updating amount of the specified parameter for use in a manual update mode according to both of the current value of the specified parameter and the setting value of the specified parameter contained in the read scene data, inputting an operation amount by means of a manual operation device operable in the manual update mode, computing an effective updating amount for the specified parameter according to the inputted operation amount and the unit updating amount determined for the specified parameter, and updating the current value of the specified parameter by the calculated effective updating amount toward the setting value of the specified parameter in response to the inputting of the operation amount by the manual operation device.

DETAILED DESCRIPTION OF THE INVENTION

Figure 1:
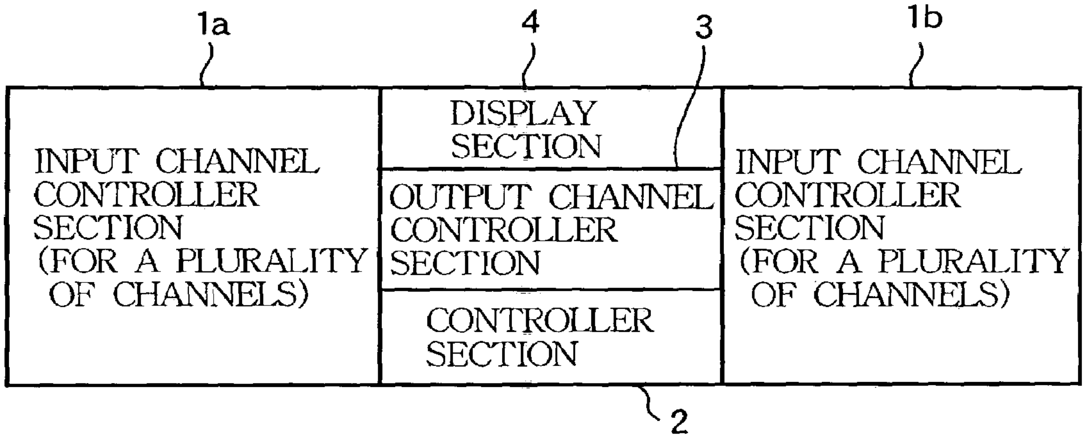
FIGS. 1(*a*) through 1(*c*) are an explanatory diagram showing an apparatus configuration according to an embodiment of the present invention.
Figure 1:
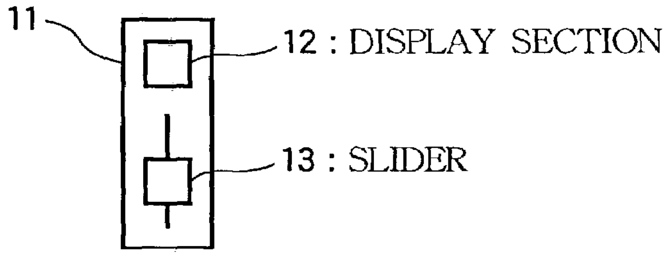
Figure 1:
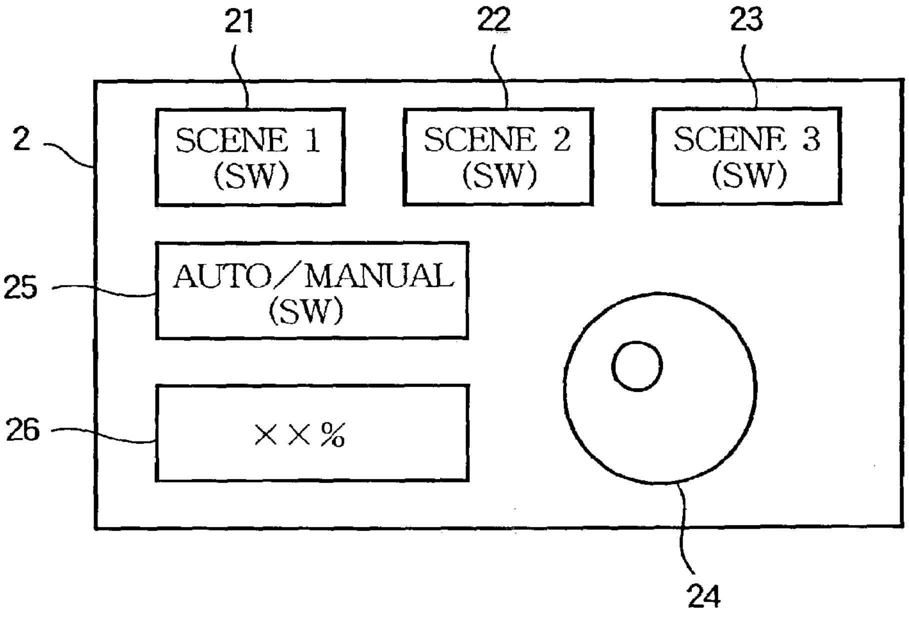

FIG. 1 is an explanatory diagram showing an apparatus configuration according to an embodiment of the present invention.

FIG. 1(*a*) shows an operation panel of an audio mixing system. In this figure, the reference numerals 1*a* and 1*b* represent input channel controller sections, 2 a general control section, 3 an output channel controller section, and 4 a display section.

FIG. 1(*b*) shows an input channel controller 11 for one channel in the input channel controller sections 1*a* and 1*b* or an output channel controller 11 for one channel in the output channel controller section 3. In the figure, the reference numeral 12 represents a display section that displays various information such as channel names directly associated with the input channel (output channel) controller 11. The reference numeral 13 denotes a slider (fader) that functions as a manual setup operation device for level control. Normally, the input channel (output channel) controller 11 is provided with one or more setup operation devices as well as the slider 13. There is also provided a plurality of setup operation devices other than those associated with the input and output channels. Some setup operation devices are displayed on a screen of the display section 4.

FIG. 1(*c*) diagrams the controller section 2. In the figure, the reference numerals 21 through 23 represent scene selection switches for selecting a plurality of scene data (1) through (3).

The reference numeral 24 represents a setup operation device capable of specifying operation directions (hereafter referred to as a bi-directional operation device) such as a rotary encoder, for example. This setup operation device is used in diverse ways and is especially used for the manual update mode of the scene function according to the embodiment.

The reference numeral 25 represents an update mode selection switch such as a toggle switch. The update mode selection switch is used to select one of the automatic update mode and the manual update mode.

The reference numeral 26 denotes a display section that displays various information such as an update progress, e.g., directly associated with the controller section.

Figure 2:
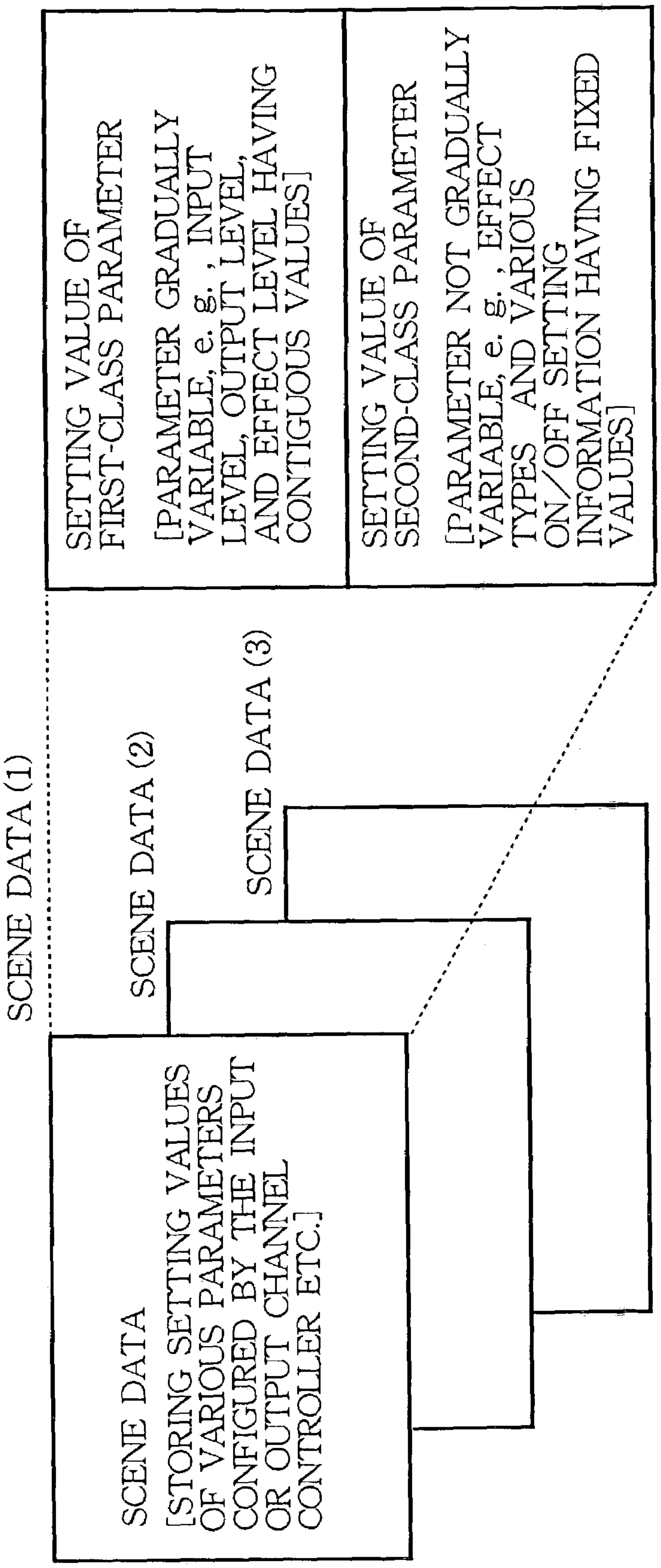
FIG. 2 shows a memory configuration for scene data.

FIG. 2 illustrates a memory configuration of scene data.

In save (store) mode, the scene selection switches 21 through 23 in FIG. 1(*c*) specify scene data numbers. The input channel (output channel) controller 11 in FIG. 1(*b*) or the like specifies a plurality of parameters, i.e., all parameters configured on the operation panel with some exceptions. Parameter setup values are stored as scene data in memory at a time.

In read (recall) mode, the scene selection switches 21 through 23 specify scene data numbers to read scene data at a time. The scene data contains a first-class parameter whose setting value can be updated progressively; and a second-class parameter whose setting value cannot be updated progressively.

For example, the slider 13 in FIG. 1(*b*) sets a continuous value for a parameter assigned thereto. During an automatic update process, the current parameter value is changed continuously. The slider 13 has an interlocked knob driven by a motor.

An update fade can be defined for a setting value of the first-class parameter by other tools than the slider 13. The second-class parameter cannot change continuously. For example, a setting value can be changed immediately when the scene data is read.

According to the embodiment, when the update fade time needs to be changed manually before scene data is read or during the current update process, the update mode selection switch 25 is used to enable the manual update mode. Then, the bi-directional operation device 24 is used to gradually update the current parameter values to setting values specified for the respective parameters.

By adjusting an operation amount of the operation device, a user can adjust the update fade time or update rate to setting values specified for the parameters according to scene data.

If the same update rate is assumed for the parameters, it is possible to complete manual update processes for the parameters at a time.

When the operation direction is reversed, the current parameter values can be returned to original setting values (initial values) before the batch setup is specified.

Figure 3:
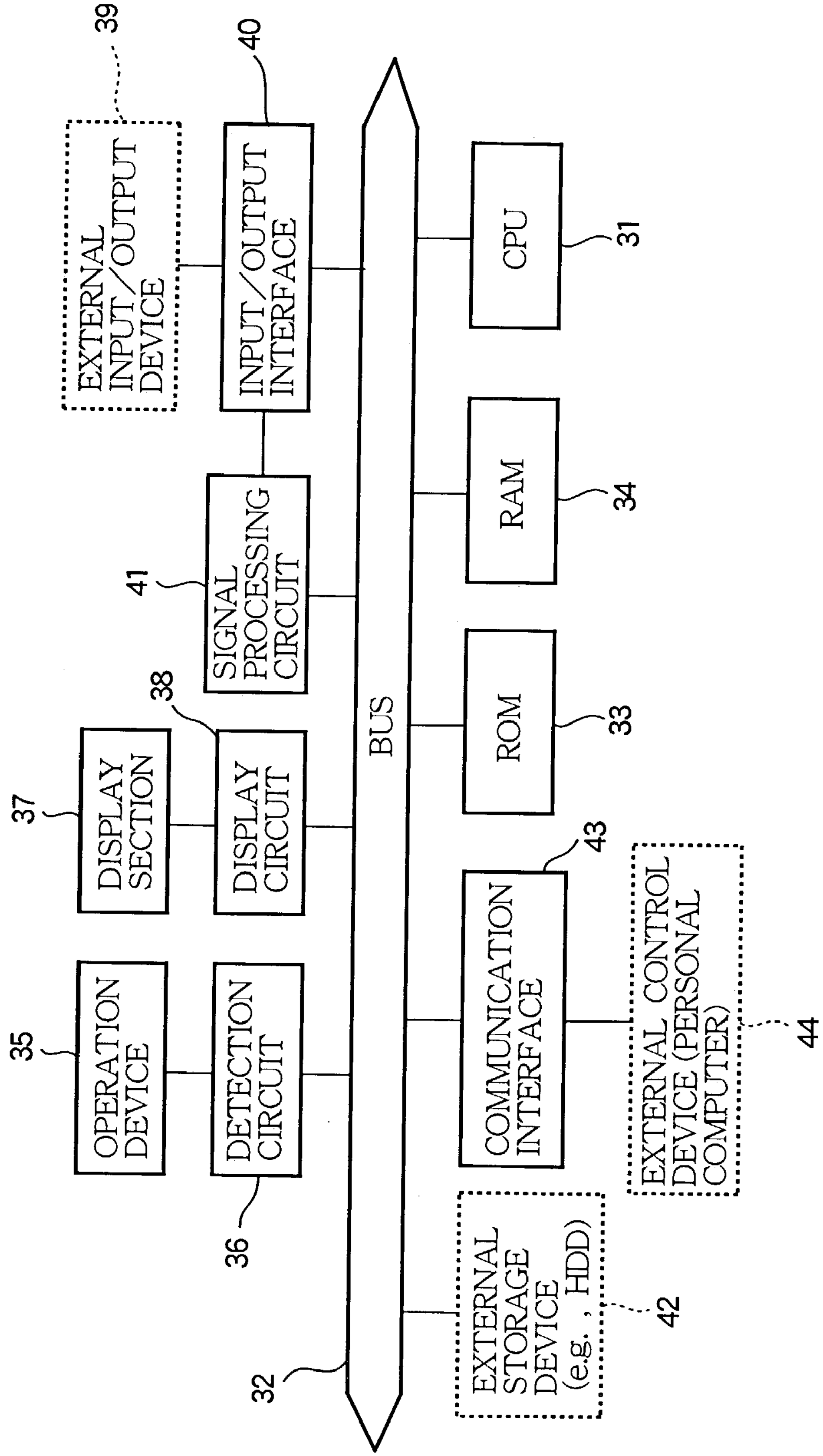
FIG. 3 is a block diagram exemplifying a hardware configuration according to the embodiment of the present invention.

FIG. 3 is a block diagram exemplifying a hardware configuration according to an embodiment of the present invention.

A CPU 31 controls overall operations of the audio mixing system via a bus 32. The CPU 31 uses RAM 34 as a work area to process programs, setting data, and the like stored in ROM 33.

An operation device 35 corresponds to each operation device on the operation panel as shown in FIG. 1(*a*). A detection circuit 36 detects an operation state of each operation device and outputs operation data to the bus 32.

A display section 37 corresponds to each of the display sections 4, 12, and 26 shown in FIGS. 1(*a*) through 1(*c*). A display circuit 38 outputs display data to the display section 37 from the bus 32.

Audio data for a plurality of channels is input from an external input/output device 39 such as a microphone and a reproduction device via an input/output interface 40 and is subject to mixing signal processing in a signal processing circuit 41. This signal processing controls (mixes) the audio data according to the control contents specified by the operation data from the operation device 35 or the scene data. The signal processing circuit 41 is implemented by a DSP (Digital Signal Processor), for example.

The scene data in FIG. 2 is saved in and read from the RAM 34. It may be preferable to store preset scene data in the ROM 33 for later use. After the mixing signal processing is applied to audio data for a plurality of channels, the audio data is output to the external input/output device 39 such as a speaker and a recording device via the input/output interface 40.

An external storage device 42 can represent, for example, a memory card, a magnetic hard disk drive, a CD-ROM drive, and the like, and saves audio data that is input or mixed.

The ROM 33 may not store control programs and setup data such as an operating system program and a setting update program for operating the CPU 31. In such case, the external storage device 42 can be used to store these programs and data and load them into the RAM 34. Further, it is possible to easily add or upgrade control programs and setup data.

A communication interface 43 is used to make connection with an external control device 44 such as a personal computer. The external control device 44 can simultaneously activate the operation device 35, the display section 37, and the control function implemented by these devices. The communication interface 43 can be compliant with a direct connection or LAN. In addition, when the communication interface 43 is compliant with public switched telephone networks or cellular phone networks, the setting update can be performed on the external control device 44 at a remote location.

When the external storage device 42 represents a memory card, a magnetic hard disk drive, and the like, it is also possible to download control programs and various data from a networked server computer.

Figure 4:
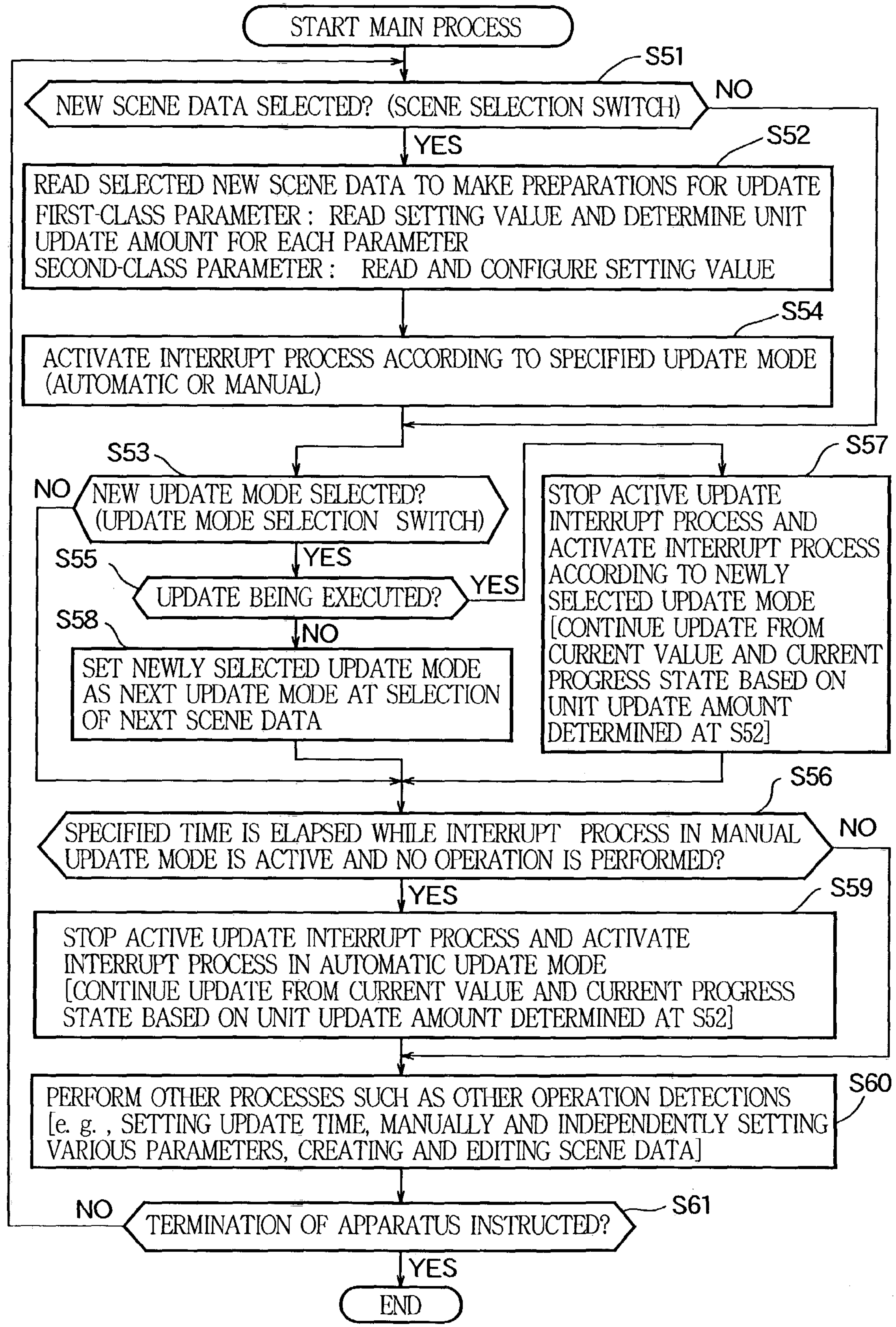
FIG. 4 shows a main flowchart of an operation example according to the embodiment of the present invention.
Figure 5:
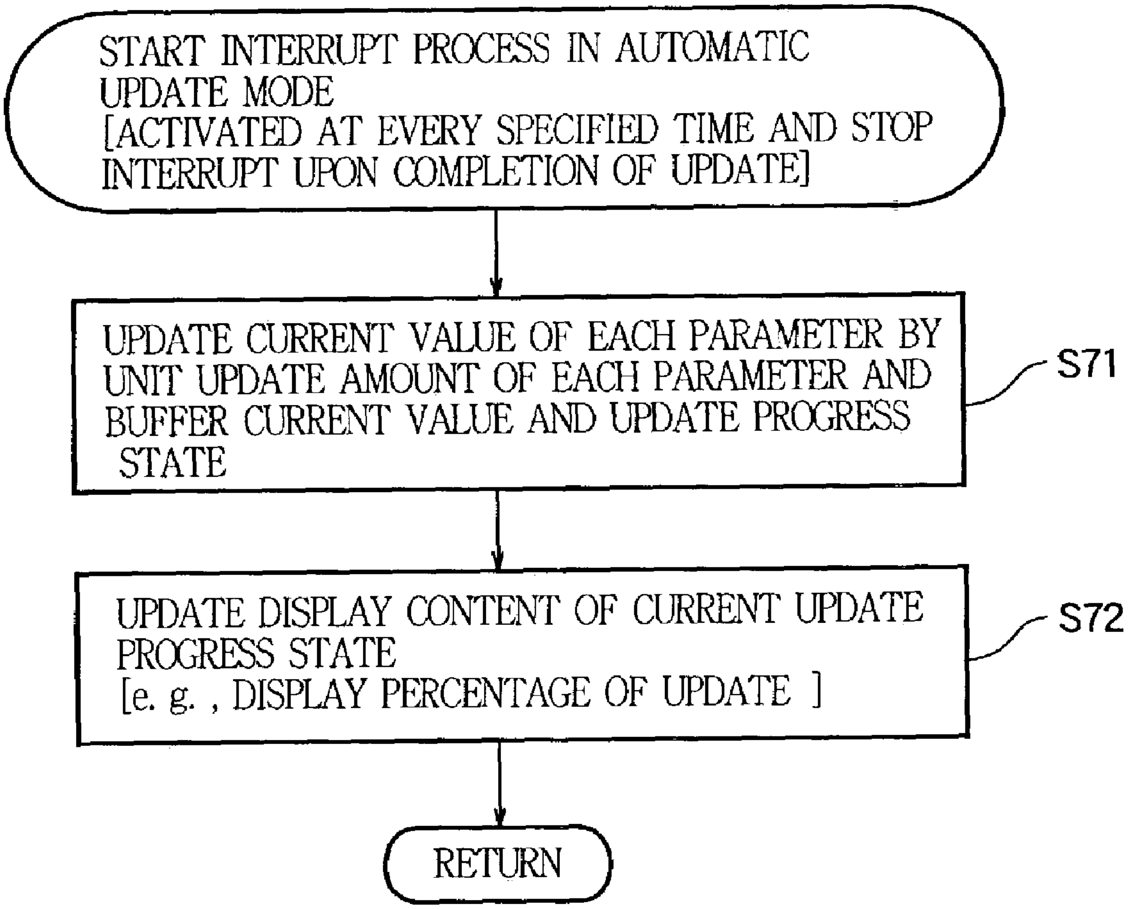
FIGS. 5(*a*) and 5(*b*) show flowcharts of operation examples according to the embodiment of the present invention for update processes when the automatic update mode and the manual update mode are selected.
Figure 5:
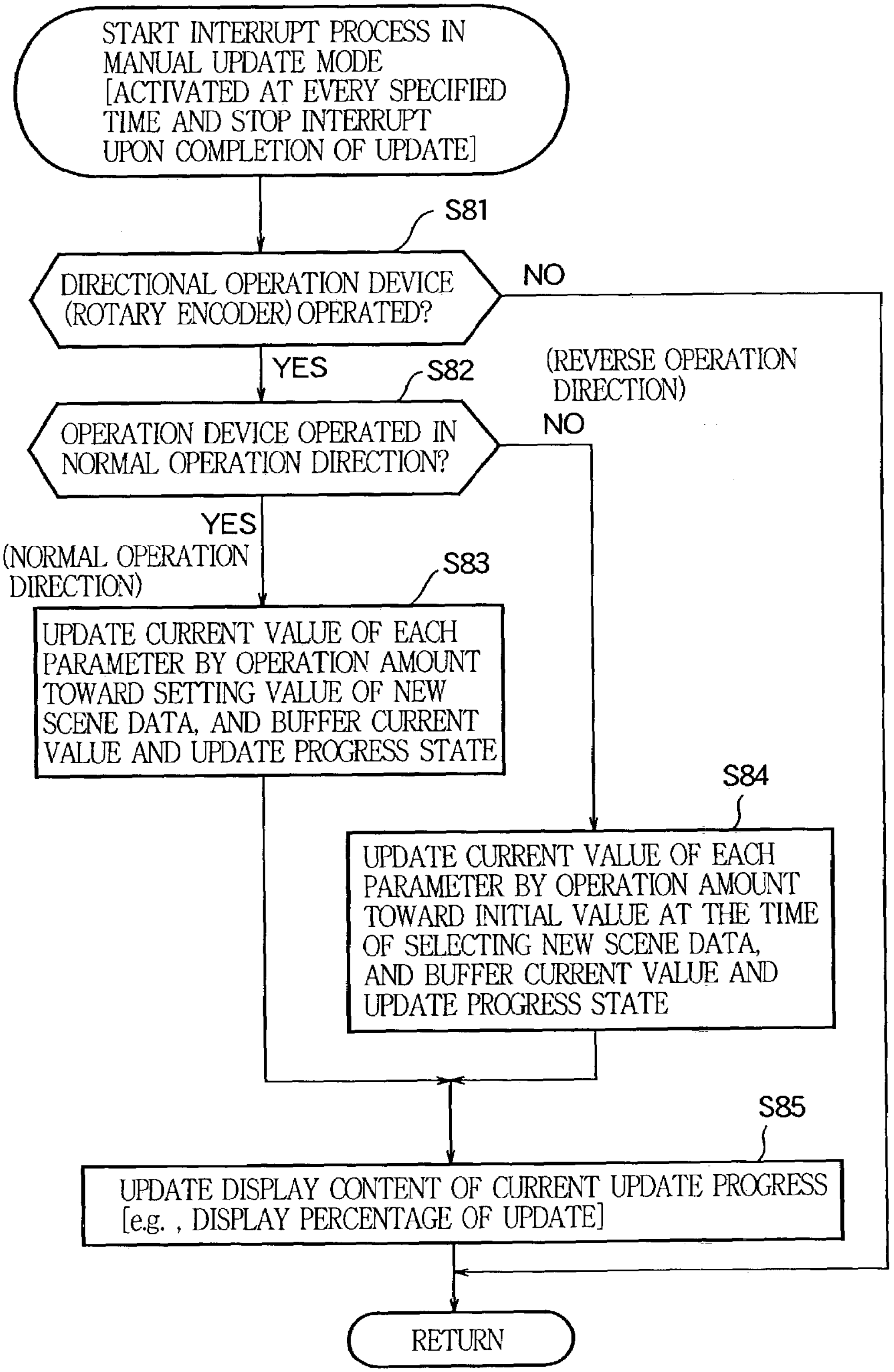

FIGS. 4 and 5 are flowcharts exemplifying operations according to the embodiment of the present invention.

The CPU 31 or the external control device 44 in FIG. 3 performs each step according to the setting update program.

FIG. 4 is a main flowchart. FIG. 5(*a*) is a flowchart using a timer interrupt to implement a process when the automatic update mode is selected. FIG. 5(*b*) is a flowchart using a timer interrupt to implement a process when the manual update mode is selected.

The process detects an operation from each of the scene selection switches 21 through 23 (FIG. 1) at S51 to determine whether or not new scene data is selected.

On the other hand, the process detects an operation of the update mode selection switch 25 (toggle switch) in FIG. 1 to determine whether or not new update mode is selected.

The process depends on operation states of the scene selection switches 21 through 23 and the update mode selection switch 25, and depends on the sequence of each operation timing.

When new scene data is selected, the process at S54 activates an update process (an interrupt process in FIG. 5(*a*) or 5(*b*) to be described later) according to the already specified update mode specified at S58 or initialized immediately after power-on.

When the new update mode is selected during update of a setting value, however, the update mode is immediately updated at S57.

The process at S52 reads setting values for a plurality of parameters specified by the scene data numbers (1) through (3).

The second-class parameter is updated immediately to reflect a read setting value.

On the other hand, the first-class parameter first requires a corresponding unit update amount. The unit update amount is determined for each of the automatic update mode and the manual update mode. A value of each parameter might be previously set on the operation panel before the new scene data is specified. Such parameter value is referred to as an initial value.

The unit update amount for automatic update mode is accumulated each time the interrupting process of automatic update mode is called and executed. The unit update amount is a nominal amount updated by one interruption process. That is to say, the unit updating amount can be formulated as follows for each parameter.

Unit update amount for automatic update mode=(setting value specified by the newly selected scene data−initial value)÷update fade time×interrupt interval As mentioned in the prior art, a user can freely set the update fade time in the above-mentioned automatic update mode. Each of a plurality of scene data contains different setting values for parameter A.

Accordingly, different values are calculated for the unit update amount in the automatic update mode depending on the update fade time, the setting value for parameter A contained in the scene data, and the like.

In the automatic update mode, the following equation is used to find the number of interrupts in an interrupt process until the setting value is reached.

Number of interrupts=Update fade time divided by interrupt interval

Here, the update fade time is specified so as to be an integral multiple of the interrupt interval.

If the specified update fade time is not an integral multiple of the interrupt interval, the number of interrupts does not become an integer value. Consequently, at an interrupt process timing when the current value exceeds the setting value for the first time, the current value exceeds the setting value to produce a fraction. In this case, it is necessary to process the fraction in order to adjust the setting value to the current value.

On the other hand, the unit update amount in manual update mode corresponds to one operation unit of the bi-directional operation device 24, e.g., for one unit operation angle (hereafter referred to as a “unit scale”) of the rotary encoder. That is to say, the unit update amount can be formulated as follows for each parameter.

Unit update amount in manual update mode=(setting value specified by the selected scene data−initial value)× proportionality constant.

The proportionality constant is the reciprocal of the total number of operation units (total number of unit scales) if it is assumed that the parameter value is updated linearly from the initial value to the setting value specified by the scene data.

The proportionality constant is also determined such that the above-mentioned total number of operation units (total number of unit scales) becomes an integer value. If the proportionality constant is determined otherwise, the current value exceeds the setting value to produce a fraction at an interrupt process timing when the current value exceeds the setting value for the first time. In this case, it is necessary to process the fraction to adjust the setting value to the current value.

It is preferable to determine the same unit update amount for the automatic update mode and the manual update mode.

In this case, it is just sufficient to calculate the unit update amount once, making it possible to save the amount of calculation for the unit update amount.

Further, in this case, the reciprocal of the above-mentioned proportionality constant becomes a value corresponding to the number of interrupts obtained by dividing the update fade time by the interrupt interval. As mentioned above, the proportionality constant is a reciprocal of the total number of operation units (total number of unit scales). Therefore, using the same unit update amount for both modes making the number of interrupts equal to the total number of operation units (total number of unit scales). As a result, there is provided an advantageous effect on a changeover between the automatic update mode and the manual update mode in the middle of the update process as will be described in specific operation examples.

The unit update amount described above may be positive (increasing) or negative (decreasing) depending on the magnitude relationship between the setting value for each parameter and the initial value.

Here, let us define a unit update rate as follows.

Unit update rate=unit update amount÷(setting value specified by the selected scene data−initial value)

Then, as seen from the above-mentioned equation for the unit update amount, the same value takes effect among plural parameters in both automatic and manual update modes.

Setting the same value for the unit update rate among the plural parameters means setting the same value for an update rate (%) defined as follows among the parameters.

Update rate (%)=(current value being update−initial value)÷(setting value specified by the selected scene data−initial value)×100

Accordingly, each parameter's current value simultaneously reaches each parameter's setting value specified by the selected scene data. Therefore, it is possible to simultaneously complete the update process for all the parameters.

At S71 in FIG. 5(*a*), the interrupt process in the automatic update mode updates each parameter's current value by the unit update amount for each parameter determined at S52. The current value being update and the update progress value are buffered.

The update amount to be incremented during the interrupt is equal to the unit update amount determined at S52 for the automatic update mode.

The interrupt process stops to complete the update when the current value reaches the setting value for the selected scene data.

In FIG. 5(*b*), the interrupt process in the manual update mode detects an operation of the bi-directional operation device 24 at S81. Then, the process proceeds to S83 or S84 according to the operation direction detected at S82. The process determines the update amount to be updated during the current interrupt process to update the current value according to the detected operation amount of the bi-directional operation device 24, i.e., the operation amount changed from the last interrupt process point.

The current value being update and the update progress value are buffered.

The update amount to be updated for the current interrupt is expressed as follows.

Update amount to be updated for the current interrupt=unit update amount determined at S52 for each parameter in the manual update mode×operation amount detected during the current interrupt.

Here, the operation amount is detected for each interrupt as follows. When the bi-directional operation device 24 outputs an operation amount corresponding to a given operation direction (e.g., clockwise direction of the rotary encoder), the operation amount is assumed to be a positive value. This makes it possible to instruct an incremental change from the current value to the setting value specified by the scene data. When the bi-directional operation device 24 outputs an operation amount corresponding to the reverse operation direction (e.g., counterclockwise direction of the rotary encoder), the operation amount is assumed to be a negative value. This makes it possible to instruct a detrimental change from the current value to the above-mentioned initial value.

The interrupt process stops to complete the update when the current value reaches the setting value for the selected scene data. Alternatively, when it is determined at S56 in FIG. 4 that a specified time elapsed while no operation is detected in the bi-directional operation device 24, the process changes to the automatic update mode at S59 and stops the interrupt process of the manual update mode.

When the update mode is changed at S57 or S59, the update continues for the current parameter value using the current value at the time of changing the mode (i.e., the buffered value) as a start point. Accordingly, the update progress based on the update rate (%) also continues using the intermediate value as a starting point. The process uses the unit update amount determined at S52 commonly for the manual or automatic update mode as mentioned above.

As described before at S52, it may be preferable to define the same unit update amount for both the automatic update mode and the manual update mode. This makes it possible to achieve the effect of decreasing the amount of computation needed for unit update amounts.

At S72 and S85, the update progress displays, for example, the above-mentioned update rate (%) on the display section 26 shown in FIG. 1(*c*). In addition, or, as an alternative, that information may be displayed on the display section 12 provided on each input channel (output channel) controller 11 having the setup operation device that is assigned with parameters to be updated.

Alternatively, it may be preferable to display the update rate (%) on the display section 26 and display the current value of the parameter being updated on the display section 12 of each input channel (output channel) controller 11 having the setup operation device that is assigned with that parameter. In this manner, the current update progress can be identified from both viewpoints: a progress as update processing and respective specific parameter values.

The method of displaying the update progress is not limited to numeric values. There may be provided any methods such as a bar graph capable of identifying the update progress.

When a change is made to the value of a parameter assigned to the slider 13 in FIG. 1(*b*), the knob of the slider 13 is moved in a motor-driven manner.

The process at S60 includes setting the update fade time, manually setting various parameters through the corresponding operation devices rather than the scene selection, saving or editing scene data, and the like.

The following describes an operation example of manually setting various parameters using respective operation devices. The example shows how to control an audio signal by transferring a parameter value itself to the signal processing circuit 41 (FIG. 3).

When a user operates the slider 13 (FIG. 1) to change the current value of the parameter buffered in the RAM 34 (FIG. 3), the changed current value of the parameter is transferred to the signal processing circuit 41 at this time. In addition, the changed current value of the parameter is buffered as a new current value.

The following describes specific operations of the manual update mode.

Given parameter A maintains value "0" when the power is turned on. Before selecting sequence data, the user operates the slider 13 (FIG. 1) to change the value to "50". This value "50" becomes the current value and is transferred to the signal processing circuit 41 (FIG. 3) to control the audio signal.

The current value is also buffered (S60 in FIG. 4).

After operating the slider 13, the user may select, e.g., scene data (1) (YES at S51 in FIG. 4). In this case, the unit update amount for this parameter A is calculated (S52 in FIG. 4) on the basis of the setting value for parameter A contained in scene data (1).

Let us assume that the setting value "100" is assigned to parameter A contained in scene data (1) and that the update fade time in the automatic update mode is set to "1000 ms". This update fade time is required after scene data (1) is selected until the setting value of parameter A contained in scene data (1) is completely reflected on control of the audio signal in the signal processing circuit 41 (FIG. 3). From a different point of view, the update fade time is consumed to make the current value for the buffered parameter A available as the setting value of parameter A contained in scene data (1).

It is assumed that the automatic update mode uses a cycle of "20 ms" to activate the interrupt process as shown in FIG. 5(*a*). In consideration of these conditions, selecting scene data (1) calculates the following.

Unit update amount in automatic update mode=(100−50)÷1000 ms×20 ms=1

Accordingly, parameter A is incremented by one each time the interrupt process in FIG. 5(*a*) is activated.

That is to say, when scene data (1) is selected, selecting the automatic update mode updates the current value of parameter A in increments of the unit update amount "1" (S71 in FIG. 5(*a*)) each time the interrupt process is activated (20 ms). After an elapse of the "1000 ms" update fade time, the current value for parameter A becomes the parameter "100" contained in scene data (1).

The following describes a case of setting the same unit update amount ("1" in this example) for the manual update mode and the automatic update mode.

It is detected that, for example, the operation direction specifiable setup operation device 24 (rotary encoder) is operated clockwise for three operation units (three unit scales) since the most recent interrupt process (20 ms ago). In this case, the current value for parameter A is incremented by 1×3 (the unit update amount×the number of detected operation units).

When the current value of parameter A approximates to the setting value "11", the user may manipulate the operation direction specifiable setup operation device 24 (rotary encoder) so as to decrease the operation amount and adjust an increment to one operation unit or less per interrupt process. In this case, it is possible to change the current value of parameter A to "97", "98", "99", "99", and "100". At a certain timing, the current value completely matches the setting value to terminate the setting update process.

Even if the unit update amount for the manual update mode differs from that for the automatic update mode, no problem occurs if the above-mentioned proportionality constant is specified so that the total number of operation units (total number of unit scales) becomes an integer value. When the update process in progress is changed from the automatic update mode to the manual update mode or vice versa, however, a problem occurs if the unit update amount for the manual update mode differs from that for the automatic update mode.

The following describes a case where a user changes the update process in progress from the automatic update mode to the manual update mode.

The above-mentioned automatic update mode uses the unit update amount "1", starts an update process from the initial value "50", updates the value at the interrupt interval "20 ms" according to the number of interrupts "50", and matches the setting value "100" to complete the update process.

Let us assume that the user changes the automatic update mode to the manual update mode when the current value for parameter A becomes "75" at the "25th" interrupt timing.

When the same unit update amount is used for the manual update mode and the automatic update mode, the manual update mode just needs to use the unit update amount "1" and change the current value for parameter A from "75" to the setting value "100". In a simple case of linear updating, the current value completely matches the setting value "100" at the "25th" operation unit. The number of interrupts in the automatic update mode is replaced by the operation unit in the manual update mode. The unit update amount is configured in the automatic update mode so that no fraction results. According to these conditions, the current value at the "25th" operation unit matches the setting value also in the manual update mode, causing no fraction.

On the other hand, let us assume that the manual update mode uses the unit update amount "2" and executes an update process from the initial value "50" to the setting value "100" based on the operation unit "25". If the current value for parameter A is linearly updated from "75" in increments of the unit update amount "2", the value becomes "101" at the "13th" operation unit, exceeding the setting value "100". Accordingly, a fraction may result depending on the current value valid at the time of changeover. The fraction needs to be processed to adjust the current value to the setting value "100".

In this case, of course, it may be preferable to calculate the unit update amount in the manual update mode in the middle of the process so that the current value becomes the setting value in integral multiples of the operation unit. For this purpose, however, the unit update amount needs to be calculated in a short time, causing large processing loads.

Accordingly, as mentioned above, it is possible to update the current value so as to match the setting value by using the same unit update amount before and after the changeover for the automatic update mode and the manual update mode.

While there has been described the changeover from the automatic update mode to the manual update mode, the same applies to the changeover from the manual update mode to the automatic update mode.

It is preferable to preferentially determine the unit update amount in the automatic update mode based on the restrictions such as update fade times, interrupt intervals, and the like, and then adjust the unit update amount in the manual update mode to that in the automatic update mode.

Accordingly, this is especially useful when the update mode is changed while the parameter value is updated according to the scene data. Even if the value of the unit update amount is used as is after the changeover, the respective parameter values can be correctly updated to the setting values by keeping the unit update amount for the manual update mode equal to that for the automatic update mode.

One scene data (1) contains a plurality of parameters. As shown in the above-mentioned example, the automatic update mode and the manual update mode are simultaneously performed for these parameters (only first-class parameters as shown in FIG. 2). The unit update amount is independently calculated for each parameter. Since the update process uses the unit update amount calculated for each parameter, all the first-class parameters simultaneously reach the respective setting values contained in the scene data (1) in the automatic update mode and the manual update mode.

According to the above-mentioned description, the unit update amount is fixed. On the contrary, if the unit update amount is changed (e.g., progressively increased or decreased) during the update process, the current value being updated can be changed in accordance with an intended change curve. In this case, update processes for respective parameters can reach completion at the same time irrespectively of the update mode by changing the unit update amount so that the above-mentioned unit update rate (update rate) is set to the same value between the parameters. In addition, the automatic update mode is configured so that the update fade time can follow a specified value.

In the above-mentioned description, the same update mode is defined for all the scene data (1) through (3). Further, it may be preferable to specify and store the update mode for the scene data (1) through (3) independently of each other.

When the scene data (1) through (3) are read in this case, the update process starts in the update mode specified for the scene data (1) through (3). If the update mode selection switch 25 is available, the update mode can be changed to the other after the update process starts.

Furthermore, it may be preferable to specify and store the unit update rate or the update rate for each of the scene data (1) through (3).

It may unnecessary to simultaneously complete update processes for the parameters in the manual update mode. In this case, the computation amount can be decreased by determining the unit update amount for each parameter in accordance with only either the setting value for each parameter specified by the above-mentioned scene data or the initial value, or independently of these values.

According to the above-mentioned description, the timer interrupt is used to execute an interrupt process in the manual update mode as shown in FIG. 5(*b*). Instead, it may be preferable to omit S81 and execute an interrupt process (event interrupt) each time an operation of the operation direction specifiable setup operation device 24 is detected.

In this case, an operation of the operation direction specifiable setup operation device 24 is detected for each operation unit (a unit operation degree or graduation of the rotary encoder) of the operation direction specifiable setup operation device 24. The value is updated in increments of the unit update amount each time this operation is detected.

Accordingly, like the timer interrupt process in the manual update mode as described with reference to FIG. 5(*b*), this is especially useful when the update mode is changed while the parameter value is updated according to the scene data. Even if the value of the unit update amount is used as is after the changeover, the respective parameter values can be updated to the setting values by keeping the unit update amount for the manual update mode equal to that for the automatic update mode without any problems of fraction processing or recalculation.

During the timer interrupt, one interrupt process may update integral multiples of the unit update amount. When the current value for parameter A approximates the setting value, it is necessary to decrease the operation amount of the operation direction specifiable setup operation device 24 (rotary encoder) for the final adjustment. During the event interrupt, on the other hand, one interrupt process updates the value just for the unit update amount, eliminating the need for special operations to conduct the final adjustment.

The above-mentioned bi-directional operation device 24 just needs to be able to specify operation directions. For example, it may be preferable to use a combination of a push button switch to specify a given operation direction and another push button switch to specify the reverse operation direction. The update mode selection switch 25 just needs to be able to change modes. For example, it may be preferable to use a combination of a push button switch to specify the manual update mode and another push button switch to specify the automatic update mode.

According to the above-mentioned description, the manual update mode is provided with the function of returning the current parameter value to the initial value when the scene data was specified. However, this function is not necessarily required. If this function is omitted, any setup operation device can be used.

The physical operation devices are actually arranged on the operation panel in FIG. 1(*a*). In order to configure various parameters, virtual and substantial operation devices are arranged on the display section 4 of the operation panel or on the screen of the external control device 44 in FIG. 3. The present invention is also applied to a setting update for collectively specifying setting values of the parameters configured by these operation devices.

The setting update apparatus according to the present invention is applied to an audio mixing apparatus having many operation devices and is mainly used in concert halls or assembly halls. However, the setting update apparatus according to the present invention can be applied not only to the audio mixing system, but also to a system including the operation panel having many operation devices for assigning a plurality of types of parameters such as electronic musical instruments and amusement game apparatuses, especially, musical instrument performance game apparatuses. An electronic musical instrument uses many operation devices to set sound volumes and effects for a plurality of systems. Data equivalent to the above-mentioned scene data is referred to as registration data.

As will be understood from the above-mentioned description, the present invention provides an advantage of being capable of quickly and appropriately adjusting the update of current values when there are collectively specified setting values for parameters configured by a plurality of operation devices.

As a result, even if an unexpected situation occurs, it is possible to cope with the situation by fast adjusting the update amount.

What is claimed is:

1. An apparatus for updating setting of at least one parameter which is set by an operation device so as to control an audio signal, the apparatus comprising:

a holding section that holds a current value of the parameter effective to control the audio signal;

a storing section that stores a plurality of scene data, each scene data comprising a set of setting values of parameters which are set by respective operation devices;

a specifying section that reads out one of the scene data from the storing section and that specifies a setting value of at least one parameter contained in the read scene data;

a determining section that determines a unit updating amount of the specified parameter for use in a manual update mode according to both of the current value of the specified parameter held in the holding section and the setting value of the specified parameter contained in the read scene data; and an updating section that includes a manual operation device operable in the manual update mode for inputting an operation amount, that computes an effective updating amount for the specified parameter according to the operation amount inputted by the manual operation device and the unit updating amount determined for the specified parameter, and that updates the current value of the specified parameter by the calculated effective updating amount toward the setting value of the specified parameter in response to the inputting of the operation amount by the manual operation device.

2. The apparatus according to claim 1, wherein the holding section holds the current values of the set of the parameters contained in each scene data, the specifying section specifies the set of the setting values of the parameters contained in the read scene data, the determining section determines a set of unit updating amounts of the specified parameters according to the set of the current values and the set of the setting values, and the updating section calculates a set of effective updating amounts corresponding to the set of the unit updating amounts of the specified parameters according to the inputted operation amount and updates the set of the current values of the specified parameters by the set of the effective updating amounts, in response to the inputting of the operation amount.

3. The apparatus according to claim 1, further comprising a display section that displays a progression state from the current value to the setting value during the course of updating of the specified parameter.

4. The apparatus according to claim 1, further comprising a direction detecting section that detects an operating direction of the manual operation device which can be operated in either of positive and negative directions, wherein the updating section increases the current value by the effective updating amount when the detected operating direction is the positive direction and decreases the current value by the effective updating amount when the detected operating direction is the negative direction.

5. The apparatus according to claim 1, wherein the determining section can determine another unit updating amount of the specified parameter for use in an automatic update mode according to both of the current value and the setting value of the specified parameter, and the updating section operates under the automatic update mode for updating the current value of the specified parameter by the determined unit updating amount every predetermined time interval toward the setting value of the specified parameter.

6. The apparatus according to claim 5, further comprising a mode detecting section that detects when one mode selected from either of the manual and automatic update modes is switched to the other mode of the manual and automatic update modes during the course of updating the specified parameter, wherein the updating section operates after the time of detecting the switching for continuing the updating of the current value held at the time of detecting the switching, under the other mode according to the unit updating amount which is determined for use in the one mode.

7. A computer program, embodied on a computer readable medium, for use in a setting update apparatus having a storage storing a plurality of scene data, each scene data comprising a set of setting values of parameters, and having a processor for updating setting of at least one parameter so as to control an audio signal, the computer program being executable by the processor for causing the apparatus to perform a method comprising the steps of:

holding current values of the parameter effective to control the audio signal;

reading out one of the scene data from the storage;

specifying a setting value of at least one parameter contained in the read scene data;

determining a unit updating amount of the specified parameter for use in a manual update mode according to both of the current value of the specified parameter and the setting value of the specified parameter contained in the read scene data;

inputting an operation amount by means of a manual operation device operable in the manual update mode;

computing an effective updating amount for the specified parameter according to the inputted operation amount and the unit updating amount determined for the specified parameter; and updating the current value of the specified parameter by the calculated effective updating amount toward the setting value of the specified parameter in response to the inputting of the operation amount by the manual operation device.

8. A method of updating setting of at least one parameter so as to control an audio signal with using a storage storing a plurality of scene data, each scene data comprising a set of setting values of parameters, the method comprising the steps of:

holding current values of the parameters effective to control the audio signal;

reading out one of the scene data from the storage;

specifying a setting value of at least one parameter contained in the read scene data;

determining a unit updating amount of the specified parameter for use in a manual update mode according to both of the current value of the specified parameter and the setting value of the specified parameter contained in the read scene data;

inputting an operation amount by means of a manual operation device operable in the manual update mode;

computing an effective updating amount for the specified parameter according to the inputted operation amount and the unit updating amount determined for the specified parameter; and updating the current value of the specified parameter by the calculated effective updating amount toward the setting value of the specified parameter in response to the inputting of the operation amount by the manual operation device.

* * * * *